United States Patent [19]

Nakata et al.

[11] Patent Number: 4,639,632
[45] Date of Patent: Jan. 27, 1987

[54] PIEZOELECTRIC RESONATOR MOUNTINGS

[75] Inventors: Hozumi Nakata, Iruma; Tsutomu Yamakawa, Kawagoe, both of Japan

[73] Assignee: Nihon Dempa Kogyo Co., Ltd., Tokyo, Japan

[21] Appl. No.: 789,928

[22] Filed: Oct. 22, 1985

Related U.S. Application Data

[63] Continuation of Ser. No. 632,408, Jul. 19, 1984, abandoned.

[30] Foreign Application Priority Data

| Jul. 27, 1983 | [JP] | Japan | 58-115596 |
| Nov. 7, 1983 | [JP] | Japan | 58-171252 |
| Dec. 23, 1983 | [JP] | Japan | 58-198264 |
| Dec. 23, 1983 | [JP] | Japan | 58-198265 |
| Dec. 27, 1983 | [JP] | Japan | 58-198940 |
| Dec. 27, 1983 | [JP] | Japan | 58-198941 |
| May 29, 1984 | [JP] | Japan | 59-78951 |

[51] Int. Cl.[4] .................................. H01L 41/08
[52] U.S. Cl. ...................................... 310/351; 310/344
[58] Field of Search .............. 310/348, 344, 351-356

[56] References Cited

U.S. PATENT DOCUMENTS

| 3,828,210 | 8/1974 | Livenick et al. | 310/351 X |
| 3,913,195 | 10/1975 | Beaver | 310/351 X |
| 3,931,388 | 1/1976 | Hafner et al. | 310/353 X |
| 3,970,880 | 7/1976 | Deutschmann et al. | 310/353 X |
| 4,360,754 | 11/1982 | Toyoshima et al. | 310/348 X |
| 4,368,402 | 1/1983 | Torii et al. | 310/353 X |
| 4,382,203 | 5/1983 | Tribby et al. | 310/352 X |
| 4,486,681 | 12/1984 | Ishigami | 310/353 |

FOREIGN PATENT DOCUMENTS

| 8011294 | 7/1980 | Fed. Rep. of Germany . |
| 8011131 | 7/1980 | Fed. Rep. of Germany . |
| 8011271 | 7/1980 | Fed. Rep. of Germany . |
| 0141812 | 11/1980 | Japan | 310/353 |
| 58-15314 | 1/1983 | Japan . |
| 1448642 | 9/1976 | United Kingdom . |
| 2002955 | 2/1979 | United Kingdom . |
| 2063558 | 6/1981 | United Kingdom . |
| 2067009 | 7/1981 | United Kingdom . |
| 2081007 | 2/1982 | United Kingdom . |
| 2111300 | 6/1983 | United Kingdom . |

Primary Examiner—Mark O. Budd
Attorney, Agent, or Firm—Frishauf, Holtz, Goodman & Woodward

[57] ABSTRACT

A piezoelectric resonator is arranged such that a pair of lead-in conductors extend through a flat hermetically sealed case obtained by bonding a pair of upper and lower halves, and are connected at projecting portions of the conductors to driving electrodes of a piezoelectric element. Electrical connections and mechanical bonding thus are provided by way of the projecting portions.

10 Claims, 45 Drawing Figures

FIG. 8
FIG. 9
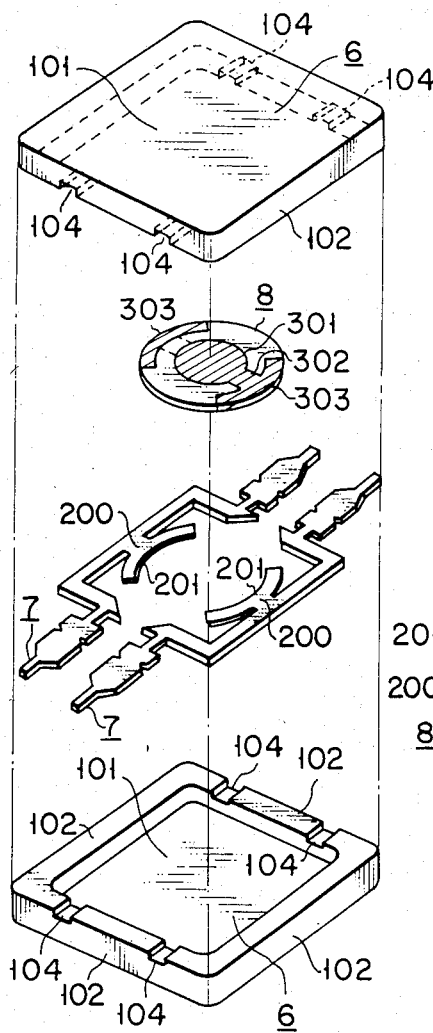
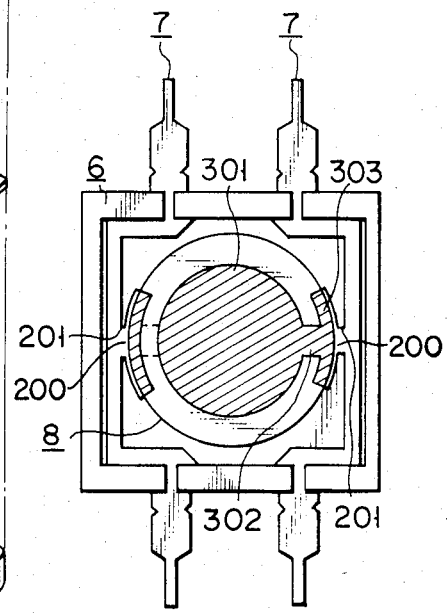

PIEZOELECTRIC RESONATOR MOUNTINGS

This application is a continuation, of application Ser. No. 632,408, filed July 19, 1984 now abandoned.

BACKGROUND OF THE INVENTION

The present invention relates to a piezoelectric resonator held in a flat case suitable for automatic assembly.

A crystal resonator having a piezoelectric property, especially, a quartz resonator, has good electrical characteristics. In industrial fields which require very precise stability of an oscillation frequency, various types of conventional quartz resonators have been used in a variety of applications.

FIG. 1 is a sectional view of a conventional quartz resonator. A pair of lead-in conductors 1 extend inside through a base 2. The lead-in conductors 1 are held by and insulated from the base 2. The lead-in conductors 1 support two edge portions of a quartz plate 3. The quartz plate 3 is obtained by cutting a quartz material at a designed angle with respect to the crystallographic axes in accordance with a desired resonant mode. Electrodes are formed on a surface of the quartz plate 3 and are connected to the lead-in conductors 1. A cover 4 is placed on the quartz plate 3, and the edge of the cover 4 is hermetically welded by resistance welding to the edge of the base 2.

In the assembly process of the quartz resonator, connection of the lead-in conductors 1 to the quartz plate 3, fine adjustment of the resonant frequency, and sealing of the base 2 and the cover 4 are time-consuming. These operations are so elaborate that assembly cannot be performed by an automatic assembly machine.

Along with the increasing demand for compact electronic equipment, the size of semiconductor elements (e.g., ICs and LSIs) and circuit elements (e.g., resistors and capacitors) has been greatly decreased. In addition, the circuit elements tend to be mounted on single chips. These circuit element packages can be automatically mounted by an automatic assembly machine such as a parts feeder at predetermined positions on a printed circuit board, thereby improving the assembly efficiency.

However, the quartz resonator shown in FIG. 1 must be mounted on the printed circuit board in such a manner that the lead-in conductors 1 are inserted in the corresponding holes and are fixed by soldering or the like. As a result, an automatic assembly machine such as a parts feeder cannot be used, thereby degrading the assembly efficiency. In addition to this disadvantage, in this quartz resonator, a metal member used to hermetically seal the base 2 and the cover 4 by cold welding, for example, increases the material cost. The cover 4 has a greater height than that of the packaged circuit elements and is thus unsuitable for electronic equipment of high packing density.

SUMMARY OF THE INVENTION

It is an object of the present invention to provide a piezoelectric resonator suitable for being automatically manufactured in a flat package form, and which can be mounted on a printed circuit board in a high packing density and automatically assembled for electronic equipment.

According to the present invention, there is provided a piezoelectric resonator which is suitable for production on an automatic manufacturing line, which has a flat chip shape, and which is suitable for automatic assembly in electronic equipment having a high packing density.

According to the present invention, there is provided a piezoelectric resonator having a piezoelectric element held in a flat sealing case, comprising:
- a case constituted by a pair of plate-like halves respectively having frame portions formed along the edges in such a manner that the frame portions oppose each other and adhere to each other;
- a pair of lead-in conductors extending through the case parallel to each other, and
- a piezoelectric element having driving electrodes connected to the pair of lead-in conductors, respectively.

BRIEF DESCRIPTION OF THE DRAWING

FIG. 8 is an exploded perspective view of a quartz resonator having lead-in conductors each having an arcuate projection according to still another embodiment of the present invention;

FIG. 9 is a plan view of the quartz resonator shown in FIG. 8;

DETAILED DESCRIPTION OF THE PREFERRED EMBODIMENTS

Figure 1:
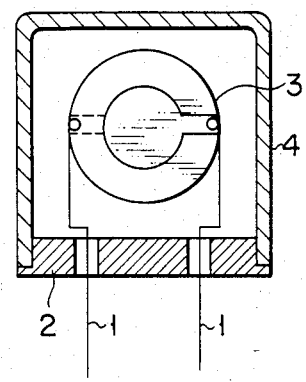
FIG. 1 is a sectional view of a conventional quartz resonator.
Figure 2:
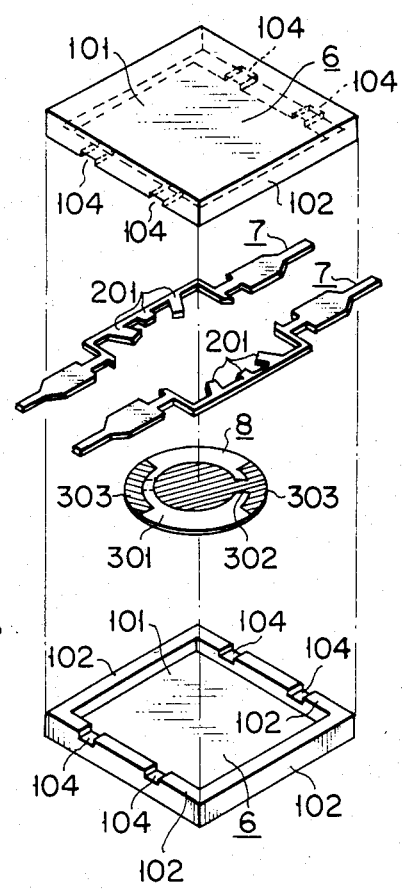
FIG. 2 is an exploded perspective view showing the parts of a quartz resonator before assembly according to an embodiment of the present invention.
Figure 3:
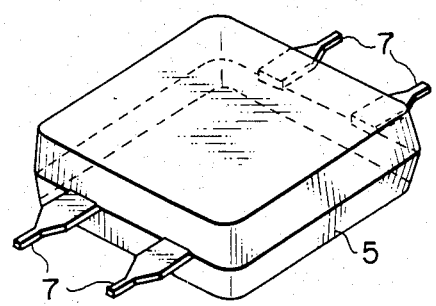
FIG. 3 is a perspective view of the finished quartz resonator of FIG. 2.

FIG. 2 is an exploded perspective view of a quartz resonator before assembly, and FIG. 3 is a perspective view of the finished quartz resonator. A flat sealing case 5 is made of, for example, ceramic or glass. The case 5 is constituted by upper and lower halves 6 in such a manner that frame portions 102 along the edges of the halves 6 are opposed and are adhered to each other. Each frame portion has a predetermined height.

Figure 4:
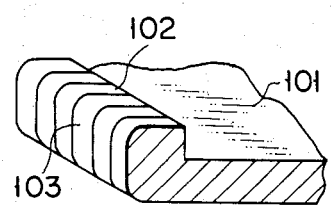
FIG. 4 is an enlarged, partial perspective view showing the edge of a frame portion of half a case shown in FIG. 2.
Figure 5:
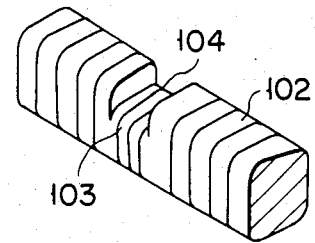
FIG. 5 is an enlarged cutaway view showing a groove in the frame portion shown in FIG. 4.

As shown in FIG. 4, the ridge portion of the frame of each half 6 comprises an arcuate surface 103. A pair of lead-in conductors 7 extend through the case 5 to be parallel to the upper or lower surface thereof. Grooves 104 are formed in the frame portions 102 so as to correspond to the conductor lead-out positions as shown in FIG. 5. The ridge at the bottom of each groove 104 also comprises the arcuate surface 103.

The pair of lead-in conductors 7 is prepared by pressing a thin metal plate. The two U-shaped lead-in conductors 7 oppose each other to provide a substantially rectangular space. A piezoelectric plate (e.g., a quartz plate 8) is placed on three projections 201 at the substantially central portion of each lead-in conductor 7 as shown in FIG. 2.

The quartz plate 8 comprises an AT-cut thickness shear mode type quartz crystal disk. Drive electrodes 301 are formed on the upper and lower surfaces of the quartz plate 8. The drive electrodes 301 are connected to conducting electrodes 303 through connecting electrodes 302, respectively. Each of the conducting electrodes 303 extends at the edge portion of the upper and lower surfaces of the quartz plate 8 at an angle of ±35 degrees with respect to the Z'-axis of the quartz plate 8. The conducting electrodes 303 of the quartz plate 8 are placed on the corresponding projections 201 of the lead-in conductors 7, respectively, and are bonded thereto by a conductive adhesive or the like, thereby becoming both electrically and mechanically connected.

The frame portions 102 of the paired halves 6 oppose each other and are bonded or sealed airtightly by an insulating adhesive or sealing material of low melting point or the like, thereby sealing the assembly of the quartz plate 8 and the corresponding portions of the lead-in conductors 7 inside the case 5.

When the lead-in conductors 7 are aligned on a single plane in the case 5, the quartz plate 8 is supported by the projections 201 of the lead-in conductors 7. Therefore, the space in the case 5 can be effectively utilized, and the dimensions of the case 5 can be greatly decreased. In particular, the pair of lead-in conductors 7 is held on a single plane and is fitted in the grooves 104 of the frame portions 102 of the upper and lower halves 6. The lead-in conductors 7 can be firmly held in the case 5, and the mechanical strength of the lead-in conductors 7 for supporting the quartz plate 8 can be increased. In addition, as the ridges of the frame portions 102 of the upper and lower halves 6 of the case 5 comprise the arcuate surfaces 103, an excessive portion of a sealing material can be removed to outside the case 5, into the arcuate portions between the halves 6 thereby eliminating dimensional errors of the case 5. In addition to this advantage, since the arcuate surfaces 103 also constitute the bottom portions of the grooves 104 for leading the lead-in conductors 7 outside, excessive stress does not act on the ridge portions of the grooves 104 when the distal portions of the conductors 7 are bent and are mounted on a printed circuit board. As a result, the case 5 will not be damaged.

The conducting electrodes 303 are formed on the edge portions of the upper and lower surfaces of the quartz plate 8 at an angle of ±35 degrees with respect to the Z'-axis thereof and are connected to the corresponding drive electrodes 301 through the corresponding connecting electrodes 302. The quartz plate 8 is held with in a plane on the projections 201 of the lead-in conductors 7 irrespective of the upper or lower surface. In this way, stress sensitivity characteristics of the quartz plate 8 will not influence the electrical characteristics thereof. Unlike the conventional device wherein the components of the quartz resonator comprise a hermetic seal base and a metal cover, the frame portions 102 of the upper and lower halves 6 are bonded to each other to constitute the hermetic seal case 5 itself. As a result, the cost of materials can be decreased, and hermetic sealing means such as resistance welding, cold welding or soldering need not be used. Therefore, the assembly process of the quartz resonator can be made suitable for automatic assembly.

Figure 6:
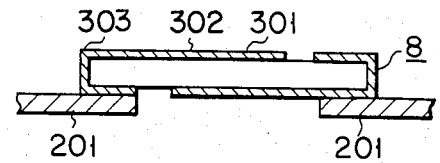
FIG. 6 is a sectional view showing a quartz plate fixed to the lead-in conductors of the quartz resonator shown in FIG. 2.

The lead-in conductors 7 are bonded between the upper and lower halves 6, so that they can be positioned substantially at the center along the thickness of the case 5. The quartz plate 8 having the drive electrodes 301, the connecting electrodes 302 and the conducting electrodes 303 is placed and fixed o the projections 201 of the lead-in conductors 7, as shown in FIG. 6. The quartz plate 8 is not positioned substantially at the center of the space along the thickness of the case 5.

Figure 7:
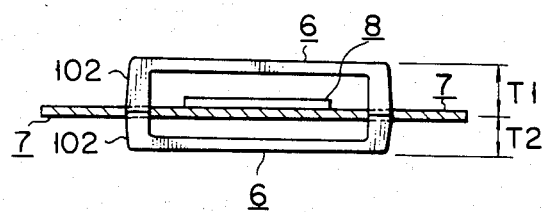
FIG. 7 is a sectional view of a quartz plate according to another embodiment of the present invention.

In another embodiment, as shown in FIG. 7, by changing heights T1 and T2 of the upper and lower halves 6, the quartz plate 8 can be positioned substantially at the center along the thickness of the case 5. In other words, the halves 6 having frame portions 102 with different heights are used, and the quartz plate 8 is positioned in a space at the side of the half 6 having the larger height. It should be noted that the quartz plate 8 can be positioned substantially at the center along the thickness of the case 5 when the difference between the heights T1 and T2 of the halves 6 is a value half the sum of the thickness of the lead-in conductor 7 and the thickness of the quartz plate 8. In this way, the space in the case 5 can be effectively used to further decrease the thickness of the case 5.

As shown in the exploded perspective view of FIG. 8, narrow-width portions 200 project from central portions of the lead-in conductors 7 and extend toward each other. The free end portions of the narrow-width portions 200 are integrally attached to central parts of arcuate projections 201 which face each other and are curved to extend inwardly of the rectangular space defined by the lead-in conductors 7.

In this case, as shown in FIG. 9, the arcuate projection 201 which has a larger area than the three projections of FIG. 2 can support the corresponding conducting electrode 303, thereby improving the mechanical strength.

Even if an external impact acts on the case 5, a damping effect is obtained since the arcuate projections 201 support the edge portions of the quartz plate 8 on the balanced center line, respectively. In addition, the quartz plate 8 is pivoted about the proximal portions of the arcuate projections 201, thus further improving the damping effect. The external impact can be attenuated by the damping effect, and the pivotal movement prevents excessive stress from causing distortion since the external force acts on the quartz plate 8 in only one direction. Therefore, the quartz plate 8 will be neither damaged by the external impact nor subjected to changes in frequency caused by changes in sensitivity which are, in turn, caused by the stress. Thus, the quartz resonator of the present invention has good resistance to impact and vibration. On the other hand, since the quartz plate 8 is pivoted about the proximal ends of the arcuate projections 201, the quartz plate 8 may bump against the upper and lower inner walls of the case 5 and may be damaged. However, since the width of the proximal end of each projection 201 is properly determined, proper rigidity is provided by the arcuate projections 201 so as to meet the specific requirements of the quartz resonator, thereby preventing damage to the quartz resonator.

When external heat is conducted through the lead-in conductors 7, heat is radiated along the arcuate projections 201. This heat radiation effect decreases the heat conducted to the quartz plate 8 and the conductive adhesive 11 adhering to the quartz plate 8 and the projections 201. Therefore, neither the strength of the conductive adhesive 11 will be weakened nor the resonant frequency will be affected easily due to the temperature characteristic of the quartz plate 8. As a result, the quartz resonator according to this embodiment has good heat resistance.

In the construction shown in FIGS. 8 and 9, when the thickness of the lead-in conductor 7 is small enough to obtain a hermetic seal, the grooves 104 need not be formed in the halves 6. In this case, a space formed when the lead-in conductors 7 are clamped between the pair of halves 6 is filled enough to be sealed with a sealing material 9. In addition, the heights of the frame portions 102 for leading out the lead-in conductors 7 may be decreased. In particular, the height of the central portion of the frame portion 102 may be decreased.

Figure 10:
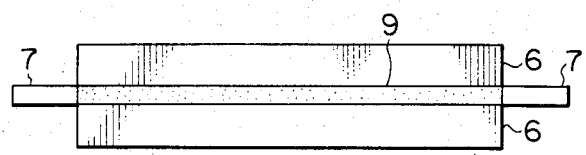
FIG. 10 is an enlarged side view showing a layer of a sealing material of the quartz resonator of FIG. 8.

When the pair of halves 6 are bonded together, a layer of the sealing material 9 is interposed between the upper and lower halves 6 as shown enlarged in FIG. 10.

Figure 11:
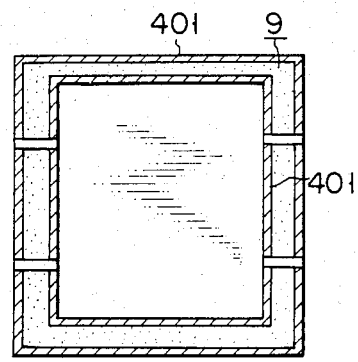
FIG. 11 is a plan view showing a state wherein an excessive amount of sealing material was used.
Figure 12:
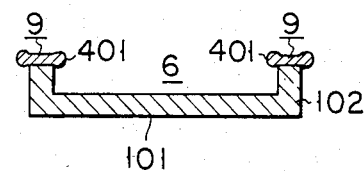
FIG. 12 is a sectional view showing the state of the excessive sealing material shown in FIG. 11.

In such a quartz resonator, the hermetic sealing property must not be impaired or else the device will be aged and, more particularly, damage to the case 5 must be prevented. For this purpose, when the pair of halves 6 are bonded together through the sealing material 9, a sufficient pressure must act on the halves 6 to minimize the thickness of the layer of the sealing material 9, thereby increasing the bonding strength. When an excessive amount of the sealing material 9 is used, excess portions 401 protrude outside and inside from the bonded portion as shown in FIGS. 11 and 12. These excess portions 401 increase the bonding strength of the halves 6. However, in practice, the inner excess portion 401 becomes attached to the peripheral portion of the quartz plate 8, thereby degrading the resonance characteristics thereof. In addition, the outer excess portion 401 results in a poor appearance of the device and a dimensional error of the case 5. In the worst case, the device is regarded as defective due to the dimensional error thereof. On the other hand, when the amount of the sealing material 9 is excessively small, the bonding strength of the case 5 is impaired thus degrading the sealing property. Therefore, the amount of the sealing material 9 must be precisely controlled at the bonding step. This precise control of the bonding process lowers the productivity efficiency.

Figure 13:
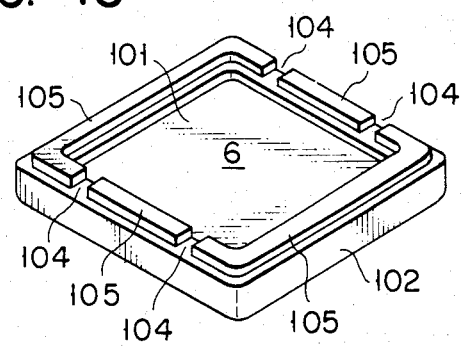
FIG. 13 is a perspective view showing half of the case of a quartz resonator according to still another embodiment of the present invention.
Figure 14:
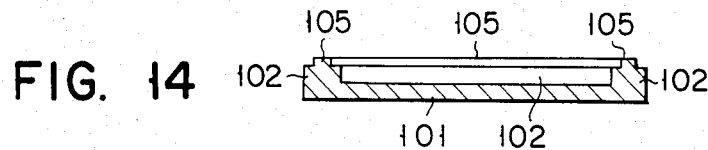
FIG. 14 is a sectional view of the half shown in FIG. 13.
Figure 15:
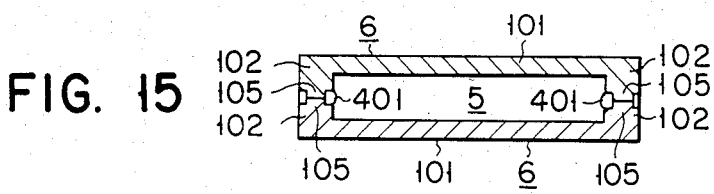
FIG. 15 is a sectional view showing a state of adhesion between the upper and lower halves of the case comprising halves as those shown in FIG. 13.
Figure 16:
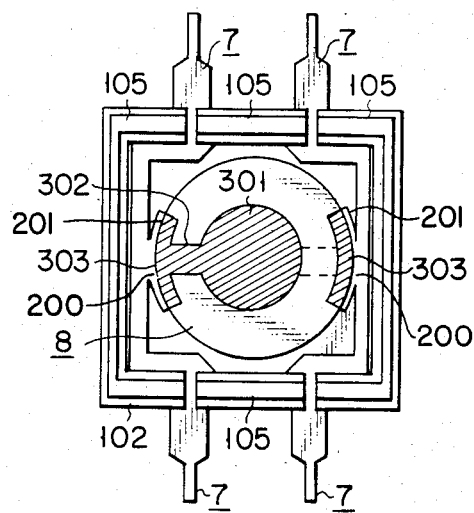
FIG. 16 is a plan view of half a quartz resonator comprising valves as shown in FIG. 13.

In order to prevent the above drawback, projections 105 are formed along the central portion of each frame portion 102, as shown in the perspective view of FIG. 13 and the sectional view of FIG. 14. As shown in FIG. 15, when the pair of halves 6 are bonded together, the excess portions 401 of the sealing material 9 are absorbed in a space formed by the projections 105. The hermetic sealing property of the case 5 can be improved as compared with that determined only by the areas of the upper surfaces of the frame portions 102. Therefore, when the pair of halves 6 having the projections 105 formed in the frame portions 102 thereof are bonded together to constitute the case 5 and a high pressure acts on the halves 6, the excess portions 401 of the sealing material 9 will not protrude inside and outside the bonded portions. As a result, the dimensional error of the case 5 and degradation of the resonance characteristics of the quartz plate 8 can be prevented. FIG. 16 is a plan view showing the inside of a quartz resonator having such a structure wherein the lead-in conductors 7 are electrically and mechanically connected to the quartz plate 8 when the upper half 6 is removed.

Figure 17:
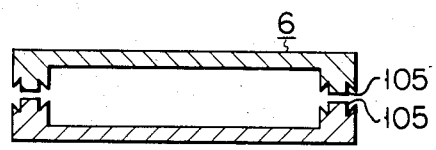
FIGS. 17, 18, 19 and 20 are sectional views showing different types of halves, respectively.
Figure 18:
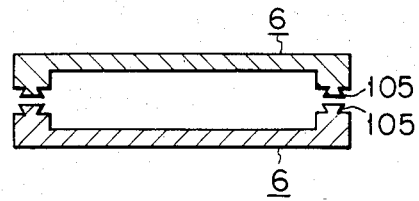
Figure 19:
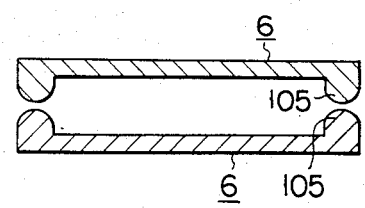
Figure 20:
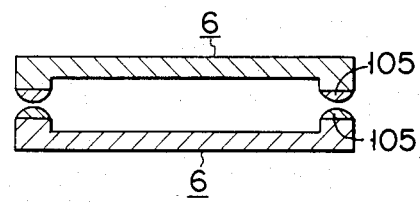

The sectional shape of each projection 105 on the frame portion 102 on the half 6 can be arranged such that the central portion has a rectangular shape, and the edge portion has a wedge shape at a predetermined angle, as shown in FIG. 17. As shown in FIG. 18, the projection 105 may comprise an inverse V-shaped portion. In addition, as shown in FIG. 19, the projection 105 may comprise an arc so as to constitute, as an arcuate surface, the upper surface of each frame portion 102. Alternatively, as shown in FIG. 20, molten glass may be coated on the surfaces of the frame portions 102.

Figure 21:
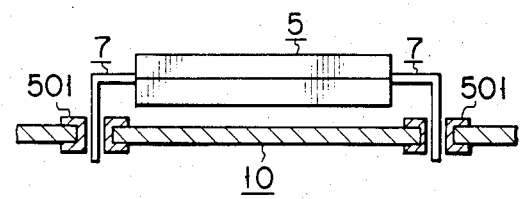
FIG. 21 is a sectional view showing a state wherein a quartz resonator according to the present invention is mounted on a printed circuit board.

The lead-in conductors 7 of the quartz resonator are bent downward at right angles, and the distal portions thereof are inserted in corresponding conductor portions 501 of a printed circuit board 10, as shown in FIG. 21. The inserted portions are soldered to the respective conductor portions 501. In this way, the quartz resonator can be automatically mounted on the printed circuit boards 10 by a parts inserter. In addition, the quartz resonator of the present invention is small and flat enough to be stably mounted on the printed circuit board 10, as compared with the conventional crystal units, and can be subjected to automatic assembly.

Figure 22:
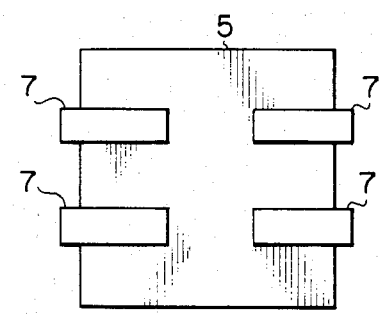
FIG. 22 is a bottom view showing a state wherein the lead-in conductors of the quartz resonator shown in FIG. 21 are bent along the surface of the lower half.
Figure 23:
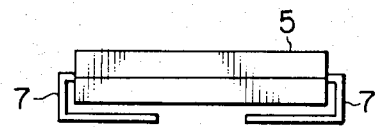
FIG. 23 is a side view of the quartz resonator shown in FIG. 22.

In many electronic parts such as capacitors and resistors, electrodes are directly formed on the surface of the electronic element and can be connected directly to the patterned terminals of the printed circuit board, thereby eliminating the need for lead wires and allowing automatic assembly. Based on this assumption, the lead-in conductors 7 of the flat quartz resonator of FIG. 21 are bent twice so as to extend along the surface of the lower half 6, thereby obtaining a pseudo leadless element, as shown in the bottom view of the quartz resonator (FIG. 22), and the side view thereof (FIG. 23).

However, when the lead-in conductors 7 are bent, an excessive stress acts on the halves 6 constituting the case 5 and hence the frame portions 102. In the worst case, the case 5 is damaged, thereby impairing the hermetic seal. When the hermetic seal is slightly degraded and particularly when the case 5 is damaged, aging occurs and the resonator cannot be used. Therefore, when the lead-in conductors 7 are bent, extreme care is taken, which degrades the assembly efficiency.

Figure 24:
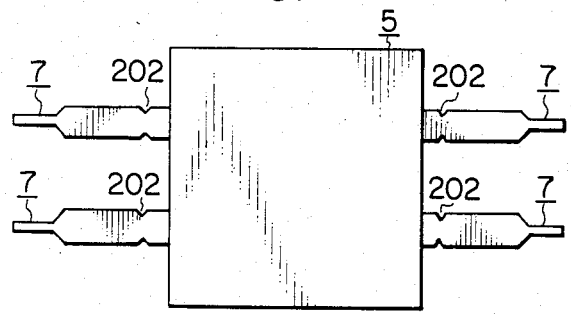
FIG. 24 is a plan view of a quartz resonator having lead-in conductors according to still another embodiment of the present invention.
Figure 25:
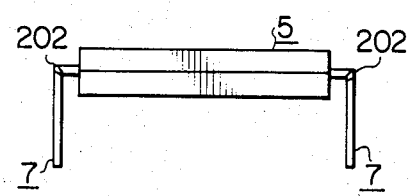
FIG. 25 is a side view showing a state wherein the lead-in conductors of the quartz resonator of FIG. 24 are bent downward.
Figure 26:
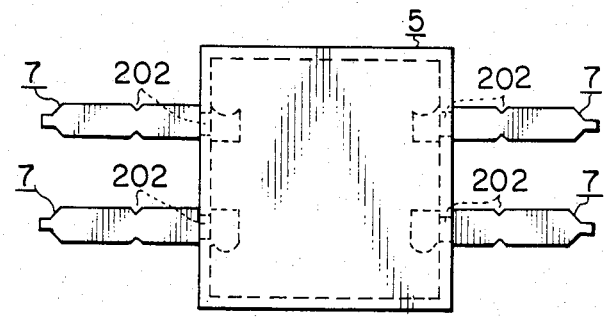
FIG. 26 is a plan view of a quartz resonator having lead-in conductors according to still another embodiment of the present invention.
Figure 27:
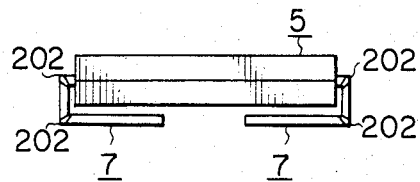
FIGS. 27 and 28 are side views showing states wherein the lead-in conductors of the quartz resonator of FIG. 26 are both bent parallel to the surface of the lower half, and wherein one lead-in conductor is bent parallel to the surface of the upper half and the other lead-in conductor is bent parallel to the surface of the lower half, respectively.
Figure 28:
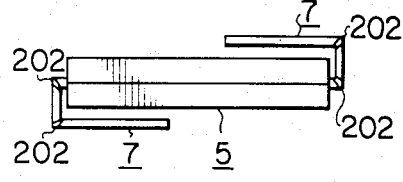

In such a case as shown in FIG. 24, triangular notches 202 are formed at predetermined positions on each side of each lead of the lead-in conductors 7 so as to oppose each other. Each lead of the lead-in conductor 7 can be easily bent at the position corresponding to the notches 202, as shown in FIG. 25. The notches 202 may be formed at two different positions at each side of each lead of the lead-in conductor 7, as shown in FIG. 26. The inner notches may be formed such that the lead portion extending through the case 5 is narrowed. Therefore, as shown in FIGS. 27 and 28, the lead-in conductors 7 can be bent along the lower surface of the case 5, and along both the upper and lower surfaces of the case, respectively. More particularly, in FIG. 27, the two ends of the lead-in conductors 7 are bent twice to extend parallel to the lower surface of the case 5. In FIG. 28, one end of the lead-in terminal 7 is bent twice to extend parallel to the upper surface of the case 5, and the other end thereof is bent twice to extend parallel to the lower surface of the case 5.

Since the notches 202 are formed at positions where the lead-in conductors 7 are bent, the lead-in conductors 7 can be easily bent, thereby preventing damage to and vacuum leakage of the case 5. In addition, the assembly operation can be greatly improved with high precision.

Figure 29:
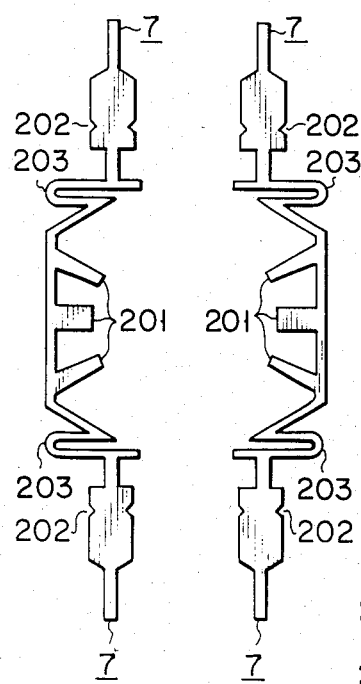
FIG. 29 is a plan view showing another pair of lead-in conductors for a quartz resonator according to still another embodiment of the present invention.

U-shaped portions 203 may be formed in the lead-in conductors 7 as in FIG. 29, respectively.

These portions 203 are formed for the following reason. Since the quartz plate 8 is supported by the projections 201 of the lead-in conductors 7, the quartz plate 8 receives a torsional stress and in the worst case is damaged when an impact acts on the quartz plate 8. Even if the quartz plate 8 is not damaged, when the quartz plate 8 is held on the lead-in conductors 7 while the lead-in conductors 7 are deformed, the resonance frequency does not meet the specific requirements due to the change in tractional sensitivity of the quartz plate 8.

In addition, when the lead-in conductors 7 are externally heated, heat is conducted to the conductive adhesive 11 for bonding the quartz plate 8 through the projections 201 of the lead-in conductors 7. As a result, the adhesion strength of the conductive adhesive 11 is apt to be weakened, and/or the resonance frequency of the quartz resonator is changed by heat abruptly.

Figure 30:
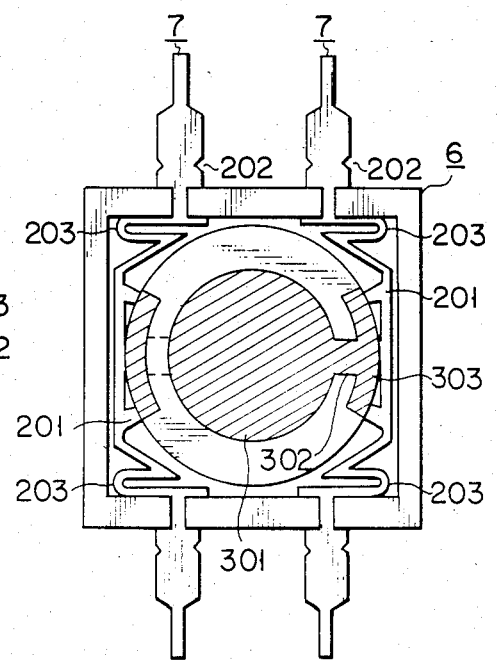
FIG. 30 is a plan view of a quartz resonator having the lead-in conductors of FIG. 29.

In order to overcome this problem, the U-shaped portions 203 are formed in the respective lead-in conductors 7. As shown in FIG. 30, the U-shaped portions 203 (FIG. 29) are positioned in spaces defined by the inner corners of the case 5 and the disk-shaped quartz plate 8. In this manner, a heat conducting path between a portion of the lead-in conductor 7, held by the frame portion 102 and the projection 201 for supporting the quartz plate 8, is elongated to elastically hold the quartz plate 8 in the case 5, thereby damping the impact and reducing the influence of heat. Therefore, the quartz plate 8 will not be damaged, and abrupt changes in the oscillating frequency which are caused by changes in temperature can be prevented since the heat conduction path is elongated. The quartz resonator has high heat resistance. In addition to this advantage, since the U-shaped portions 203 are positioned between four inner corners of the case 5 and the periphery of the quartz plate 8, the inner area of the case 5 can be effectively utilized, and the size of the resonator need not be increased in order to improve impact and heat resistances.

It is desirable that impact and vibration resistances of the quartz resonator not be improved over those of electronic parts such as resistors, capacitors and semiconductor elements. This is also the case even in resonators held in the flat case 5.

Figure 31:
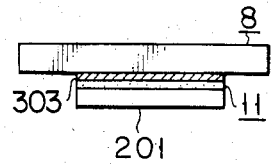
FIG. 31 is a sectional view showing an adhesion state of the lead-in conductors and the quartz plate according to the present invention.

According to the quartz resonator of the present invention, the projections 201 of the lead-in conductors 7 are electromechanically connected to the conducting electrodes 303 of the quartz plate 8 through the conductive adhesive 11, as shown in FIG. 31. However, in case that quartz resonators of this type were dropped from a height of 75 cm onto a hard board in a shock test, some conducting electrodes 303 deposited on the quartz resonators, happened to be peeled off without any damages on the quartz plates 8. The conducting electrodes 303 control the mechanical support strength of the lead-in conductors 7 greatly. This is due to the fact that the adhesion strength between the conducting electrodes 303 and the quartz plate 8 is inferior to that between the conducting electrodes 303 and the conductive adhesive 11, when an impact by dropping the quartz resonator acts on the portions around the conductive adhesive 11 for bonding the conducting electrodes 303 of the quartz plate 8 and the projections 201.

Figure 32:
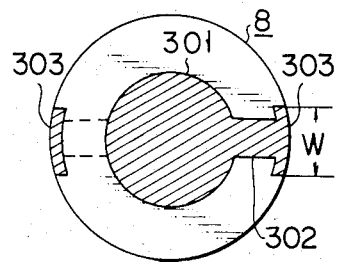
FIG. 32 is a plan view showing a quartz plate having a different electrode shape according to the present invention.
Figure 33:
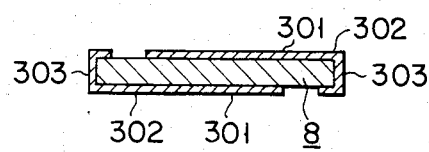
FIG. 33 is a sectional view of the quartz plate shown in FIG. 32.
Figure 34:
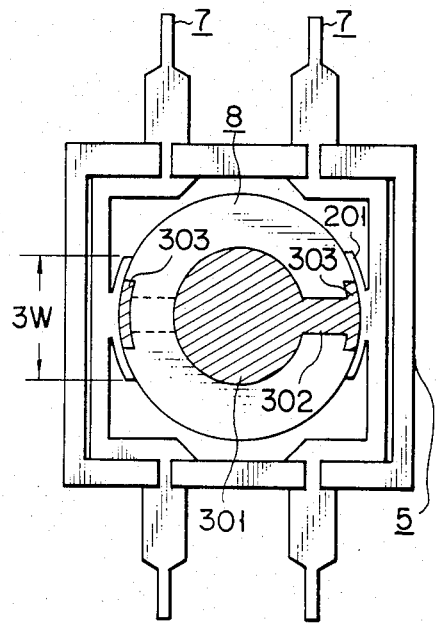
FIG. 34 is a plan view of a quartz resonator using the quartz plate of FIG. 32.

Commonly, as shown in FIG. 32, each driving electrode 301 is formed substantially at the center of the upper and lower surfaces of the AT-cut (i.e., thickness shear mode) quartz plate 8. The connecting electrodes 302 extend from the corresponding driving electrodes 301 toward the corresponding edges, and the conducting electrodes 303 are formed extending to the opposing surfaces through the corresponding connecting electrodes 302, respectively. FIG. 33 is a sectional view of the quartz plate 8 described above. As is apparent from FIG. 33, each conducting electrode 303 is folded around the edge from the upper/lower surface to the lower/upper surface. This quartz plate 8 is bonded to the projections 201 at the centers of the lead-in conductors 7, as shown in FIG. 34. In this case, the total width of the projections 201 is about three times (i.e., 3W) a width W of the conducting electrode 303 on the quartz plate 8.

Figure 35:
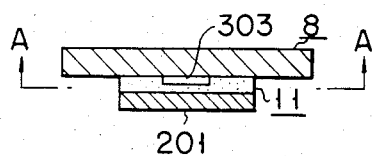
FIG. 35 is a sectional view showing an adhesion state of the quartz plate and the lead-in conductors of the quartz resonator of FIG. 34.
Figure 36:
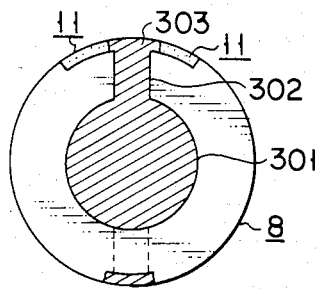
FIG. 36 is a plan view of the quartz plate shown in FIG. 35.

FIG. 35 is a sectional view showing the adhesion state between the quartz plate 8 and the lead-in conductor 7. As shown in FIG. 35, the projection 201 is adhered to the conducting electrode 303 through the conductive adhesive 11 at a portion where the conducting electrode 303 is formed. In addition, the projection 201 is also adhered directly to the quartz plate 8 at a portion where the conducting electrode 303 is not formed. A shown in the sectional view of FIG. 36 which is taken along the line A—A in FIG. 35, the conducting electrode 303 is positioned substantially at the center of the projection 201 of the lead-in conductor 7. The conductive adhesive 11 is applied to the entire surface of the projection 201, and the conducting electrode 303 is adhered to the projection 201 thereby. The projection 201 is thus electrically connected to the conducting electrode 303 through the conductive adhesive 11. In addition, the projection 201 is also mechanically bonded to peripheral portions of the quartz plate 8 which do not have the conducting electrode 303 thereon, independent of the electric connection between the conducting electrode 303 and the projection 201. Therefore, the projection 201 of each lead-in conductor 7 is mechanically bonded to the quartz plate 8 over a wide area since the projection 201 is adhered to the quartz plate 8 both directly and through the conducting electrode 303, thereby improving the adhesion strength. Therefore, the conducting electrode 303 will not peel off from the quartz plate 8 even if an external impact acts on the quartz plate 8. As a result, high impact and vibration resistances can be obtained.

Figure 37:
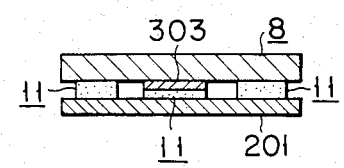
FIG. 37 is a sectional view showing an adhesion state of a crystal plate and lead-in conductors in a quartz resonator according to still another embodiment of the present invention.
Figure 38:
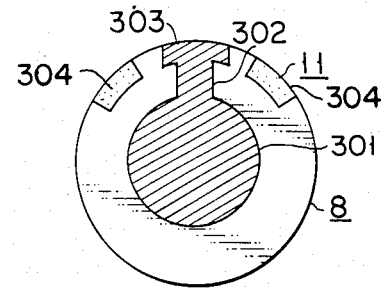
FIG. 38 is a plan view of the quartz plate shown in FIG. 37.

In this case, as shown in the sectional view of the bonded portion in FIG. 37 and the plan view of a quartz plate 8 in FIG. 38, the projections 201 of each lead-in conductor 7 may be bonded to the corresponding portions (the conducting electrode 303 and separate peripheral non-conducting edge portions 304 of the quartz plate 8) of the quartz plate 8 through the conductive adhesive 11. In this case, a slight decrease in the bonding area slightly decreases the mechanical strength.

However, the quartz plate 8 can freely vibrate, thereby obtaining good vibration characteristics. In this manner, even if the projections 201 are directly adhered to the quartz plate 8, the conductive adhesive 11 is used to make the bonding operation easy. In addition, the mass of the conductive adhesive 11 is larger than that of the insulating adhesive, thereby improving the damping effect against an external impact.

Figure 39:
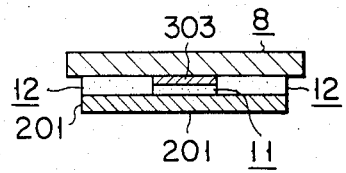
FIG. 39 is a sectional view showing an adhesion state of a quartz plate and lead-in conductors in a quartz resonator according to still another embodiment of the present invention.

When productivity may be neglected, as shown in FIG. 39, the conducting electrode 303 is bonded to the projection 201 through the conductive adhesive 11, and the other portion of the projection 201 is bonded to the corresponding portion of the quartz plate 8 through an insulating adhesive 12 which has a elastic property so as to provide a damping effect.

Figure 40:
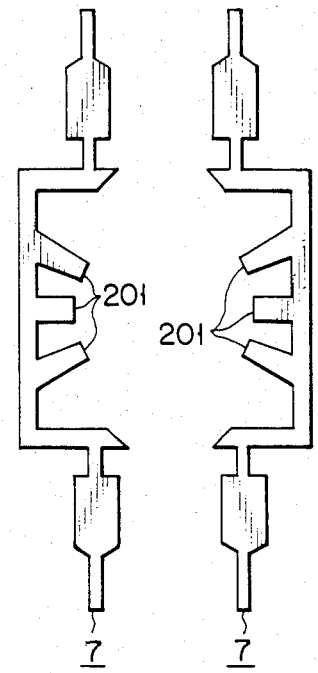
FIG. 40 is a plan view of another pair of lead-in conductors according to the present invention.
Figure 41:
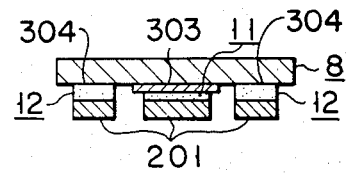
FIG. 41 is a sectional view showing an adhesion state of the lead-in conductors of FIG. 40 and a quartz plate.

As is apparent from the plan view in FIG. 40, when three projections 201 are provided in each lead-in conductor 7, the conducting electrode 303 may be bonded to the central projection 201 through the conductive adhesive 11, and the right and left projections 201 may be bonded to the corresponding peripheral portions of the quartz plate 8 through a insulating adhesive 12 which has an elastic property so as to provide a damping effect.

However, when the arcuate projection 201 is formed in each lead-in conductor 7, as shown in FIG. 8, the width of the projection 201 must be minimized to decrease the contact area between the projection 201 and the quartz plate 8 and assure sufficient connection strength from the viewpoints of the impact and vibration resistances and the vibration characteristics. For example, when the projection 201 has a small width (e.g, 0.27 mm) and supports the quartz plate 8 having a diameter of 9 mm, the amount of the conductive adhesive 11 applied to the projection 201 becomes very small, and sufficient bonding strength cannot be obtained, thus failing to satisfy the prescribed impact resistance. The arcuate projections 201 are connected to the corresponding edge portions of the quartz plate 8 through the conductive adhesive 11. For this reason, when an external impact acts on the quartz plate 8, the quartz plate 8 is pivoted about the proximal ends of the projections 201 of the lead-in conductors 7, and the adhesion strength between the lead-in conductors 7 and the quartz plate 8 is impaired, thereby reducing the impact resistance. When the arcuate projection 201 having a width of 0.27 mm is used to obtain sufficient bonding strength by using the conductive adhesive 11, the adhesive operation becomes cumbersome, resulting in a decrease in productivity.

Figure 42:
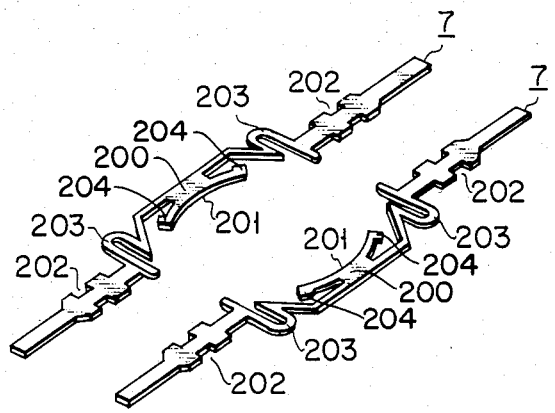
FIG. 42 is a perspective view showing lead-in conductors.
Figure 43:
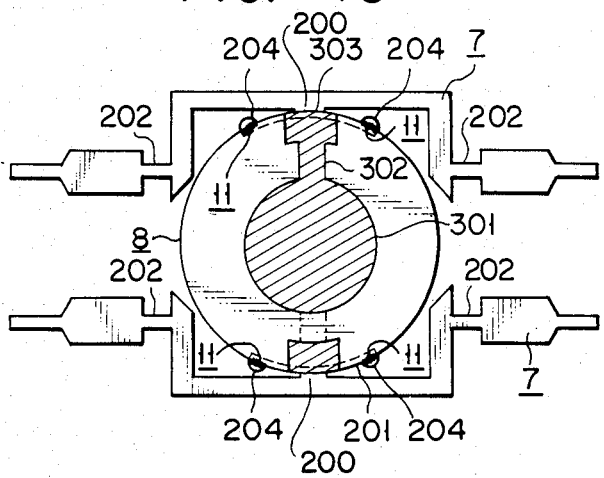
FIG. 43 is a plan view of a quartz resonator having the lead-in conductors according to still another embodiment of the present invention.
Figure 44:
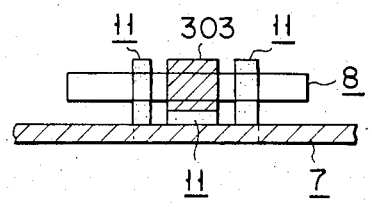
FIG. 44 is a sectional view showing an adhesive state of the quartz plate and the lead-in conductors in the quartz resonator of FIG. 43.

In order to overcome the above disadvantage, enlarged portions 204 are formed at both ends of each arcuate projection 201 so as to extend outward from the edge of the quartz plate 8 when the quartz plate 8 is mounted on the arcuate projections 201, as shown in FIG. 42. As shown in the plan view of FIG. 43 and the sectional view of the adhered portion in FIG. 44, the conductive adhesive 11 is applied to the central portion and the enlarged portions 204 of each lead-in conductor 7, and the quartz plate 8 is fixed on the corresponding lead-in conductors 7. In this case, the conducting electrode 303 of the quartz plate 8 is adhered to the center of the corresponding projection 201 to provide an electrical connection and mechanical support. When the width of the arcuate projection 201 exceeds 0.27 mm, each enlarged portion 204 comprises a spherical shape with a radius of about 0.5 mm. Therefore, the width of the projection 201 at the enlarged portion 204 becomes about three times the size of the enlarged portion 204. This allows the application of a great amount of the conductive adhesive 11. As a result, the quartz plate 8 can firmly adhere to the lead-in conductors 7 and the impact resistance can be improved.

Figure 45:
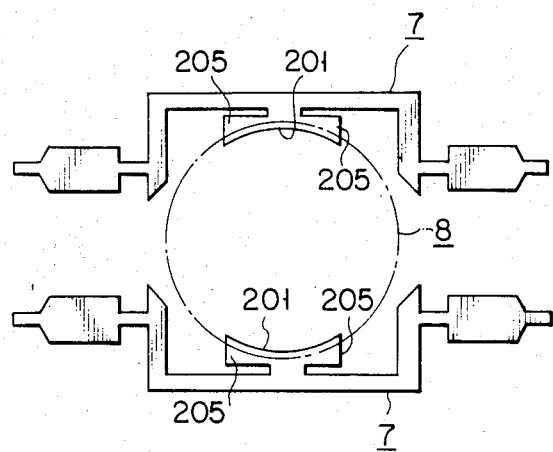
FIG. 45 is a plan view of another pair of lead-in conductors according to still another embodiment of the present invention.

As shown in FIG. 45, lead-in conductors 7 may have projections 201. Each projection 201 has an arcuate front edge and a linear rear edge. In this manner, the projection 201 can have wide portions 205 at its both ends. A sufficient amount of conductive adhesive 11 can be easily applied to these wide portions 205. The quartz plate 8 can be firmly bonded to the lead-in conductors 7, and high impact and vibration resistances can be obtained.

In the lead-in conductor 7 having the enlarged portions 204 shown in FIG. 42 or the wide portions 205 shown in FIG. 45, the central portion of the projection 201 must be adhered to the conducting electrode 303 through the conductive adhesive 11, but both ends of the projection 201 may be bonded to the edge portions 304 of the quartz plate 8 through an insulating adhesive preferably having elasticity.

What is claimed is:

1. A piezoelectric resonator, comprising:
    a case including a pair of plate-like halves each of which has a frame portion along its edge, wherein said frame portions oppose each other and can adhere to each other;
    a generally planar piezoelectric element including driving elements at central parts of its upper and lower surfaces, connecting electrodes extending, in opposite directions, from said driving electrodes toward edges of said upper and lower surfaces of the piezoelectric element, and conducting electrodes provided at parts of the edges of said upper and lower surfaces of the piezoelectric element to connect with said connecting electrodes;
    a pair of lead-in conductors penetrating side portions of said case generally parallel to each other, said conductors including narrow-width portions which project from central portions of said conductors toward one another, arcuate projections each integrally connected at a central part to free ends of associated ones of said narrow-width portions wherein said projections are curved to extend inwardly of a region bounded by said conductors, and U shaped portions for reducing the effect of thermal conditions and mechanical vibration on said piezoelectric element when supported by said electrodes within said case, wherein the central parts of said arcuate projections of said lead-in conductors are attached and electrically connected to said conducting electrodes at the edge parts of the piezoelectric element by a conductive adhesive agent, and end portions of said arcuate projections are attached to regions of said piezoelectric element outside of the conducting electrode edge parts by an adhesive agent.

2. A piezoelectric resonator according to claim 1, wherein said piezoelectric element comprises a quartz plate.

3. A piezoelectric resonator according to claim 1, wherein each of said frame portions has an arcuate ridge along its outer edge.

4. A piezoelectric resonator according to claim 1, wherein said frame portions have different heights.

5. A piezoelectric resonator according to claim 1, wherein each of said frame portions has pairs of grooves in an upper surface thereof for leading out a corresponding one of said pair of lead-in conductors.

6. A piezoelectric resonator according to claim 1, each of said frame portions has notches along inner and outer sides on an upper surface of the frame portion.

7. A piezoelectric resonator according to claim 1, wherein each lead-in conductor has notches along both sides of the conductor, said notches being located where a pair of leads of each lead-in conductor is bent.

8. A piezoelectric resonator according to claim 1, wherein said case comprises a ceramic material.

9. A piezoelectric resonator according to claim 1, wherein each of said arcuate projections has enlarged portions at both ends.

10. A piezoelectric resonator according to claim 1, wherein the end portions of said arcuate projections of said lead-in conductors are attached to said piezoelectric element by an elastic insulating adhesive.

* * * * *